US012653003B2

(12) United States Patent
Liu et al.

(10) Patent No.: US 12,653,003 B2
(45) Date of Patent: Jun. 9, 2026

(54) METHOD OF PROFILE CONTROL FOR SEMICONDUCTOR MANUFACTURING

(71) Applicant: Tokyo Electron Limited, Tokyo (JP)

(72) Inventors: Eric Chih-Fang Liu, Albany, NY (US);
David L. O'Meara, Albany, NY (US)

(73) Assignee: TOKYO ELECTRON LIMITED,
Tokyo (JP)

( * ) Notice: Subject to any disclaimer, the term of this patent is extended or adjusted under 35 U.S.C. 154(b) by 813 days.

(21) Appl. No.: 18/054,083

(22) Filed: Nov. 9, 2022

(65) Prior Publication Data

US 2024/0153770 A1    May 9, 2024

(51) Int. Cl.
H10P 50/20 (2026.01)
H10P 50/00 (2026.01)
H10P 50/28 (2026.01)
H10P 76/20 (2026.01)
H10P 76/40 (2026.01)

(52) U.S. Cl.
CPC .......... H10P 76/405 (2026.01); H10P 50/283 (2026.01); H10P 50/73 (2026.01); H10P 76/20 (2026.01); H10P 76/4085 (2026.01)

(58) Field of Classification Search
CPC . H01L 21/3065; H01L 21/31056; H10P 50/20
See application file for complete search history.

(56) References Cited

U.S. PATENT DOCUMENTS

| | | | |
|---|---|---|---|
| 5,328,810 | A | 7/1994 | Lowrey et al. |
| 8,211,759 | B2 | 7/2012 | Anderson et al. |
| 8,455,364 | B2 | 6/2013 | Kanakasabapathy |
| 8,586,482 | B2 | 11/2013 | Arnold et al. |
| 8,673,725 | B2 | 3/2014 | O'Meara et al. |
| 9,240,329 | B2 | 1/2016 | deVilliers |
| 9,337,050 | B1 | 5/2016 | Xie et al. |
| 9,500,946 | B2 | 11/2016 | Chae et al. |
| 9,564,342 | B2 | 2/2017 | Ogasawara |
| 11,417,526 | B2 | 8/2022 | O'Meara et al. |
| 2015/0155380 | A1* | 6/2015 | Schulze ................. H10D 62/53 |
| | | | 438/492 |
| 2015/0162238 | A1* | 6/2015 | Huang ................ H01L 21/0337 |
| | | | 438/692 |
| 2021/0057226 | A1* | 2/2021 | O'Meara ............. C23C 16/4584 |
| 2021/0407804 | A1 | 12/2021 | Ko et al. |

* cited by examiner

*Primary Examiner* — Thomas T Pham
(74) *Attorney, Agent, or Firm* — Slater Matsil, LLP

(57)    ABSTRACT

A method of forming a semiconductor structure includes forming a first mandrel layer over a target layer, forming a second mandrel layer over the first mandrel layer, and patterning a mandrel by etching the second mandrel layer and the first mandrel layer. The first mandrel layer has a first etch rate and the second mandrel layer has a second etch rate less than the first etch rate.

20 Claims, 14 Drawing Sheets

100

100

100

312

308

306

304

102

100

306

314

102

500

600

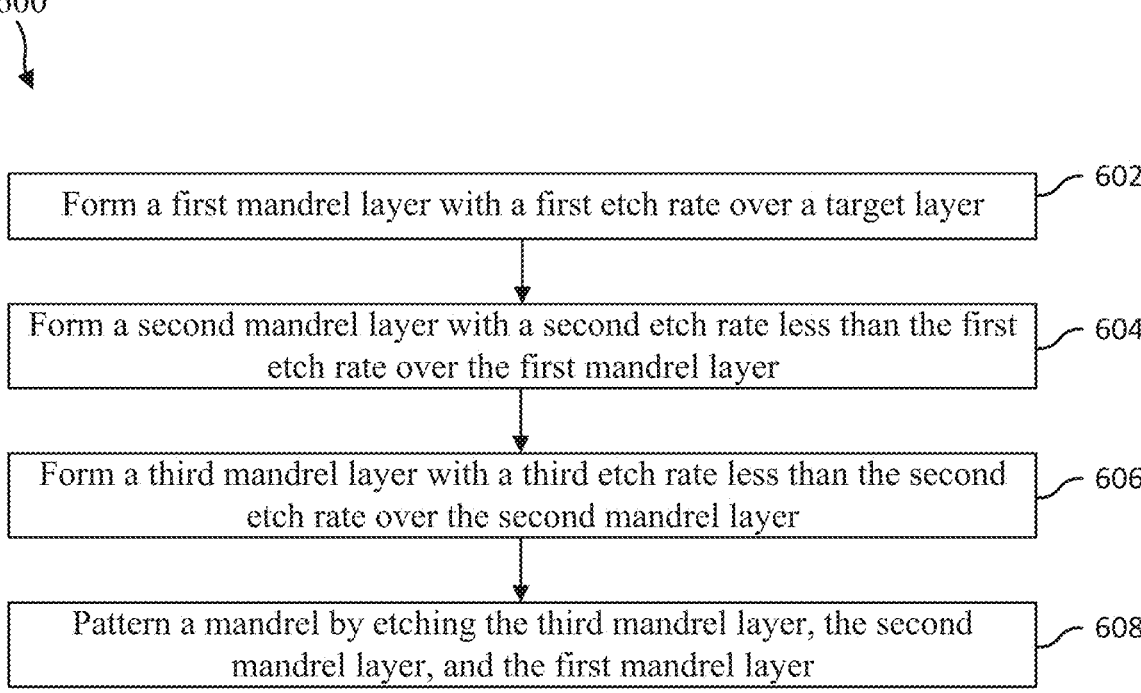

602
Form a first mandrel layer with a first etch rate over a target layer

604
Form a second mandrel layer with a second etch rate less than the first etch rate over the first mandrel layer 606
Form a third mandrel layer with a third etch rate less than the second etch rate over the second mandrel layer 608
Pattern a mandrel by etching the third mandrel layer, the second mandrel layer, and the first mandrel layer

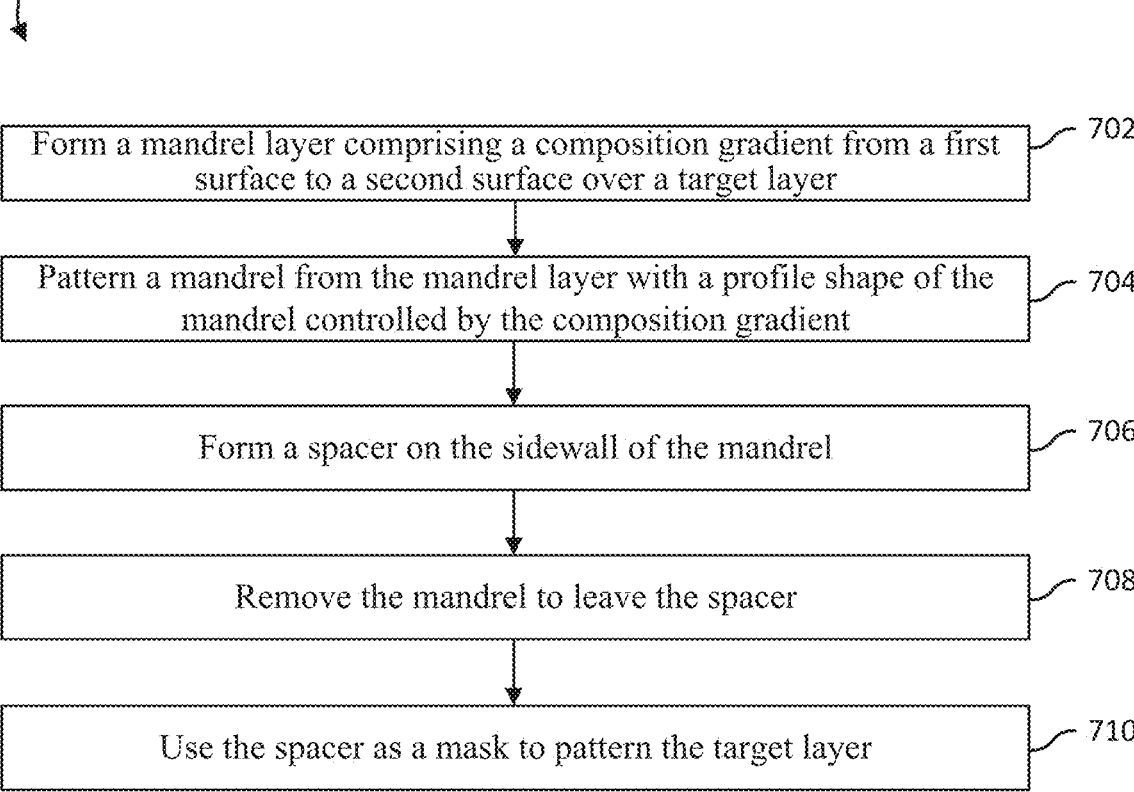

Form a mandrel layer comprising a composition gradient from a first surface to a second surface over a target layer — 702

Pattern a mandrel from the mandrel layer with a profile shape of the mandrel controlled by the composition gradient — 704

Form a spacer on the sidewall of the mandrel — 706

Remove the mandrel to leave the spacer — 708

Use the spacer as a mask to pattern the target layer — 710

FIGURE 20

800

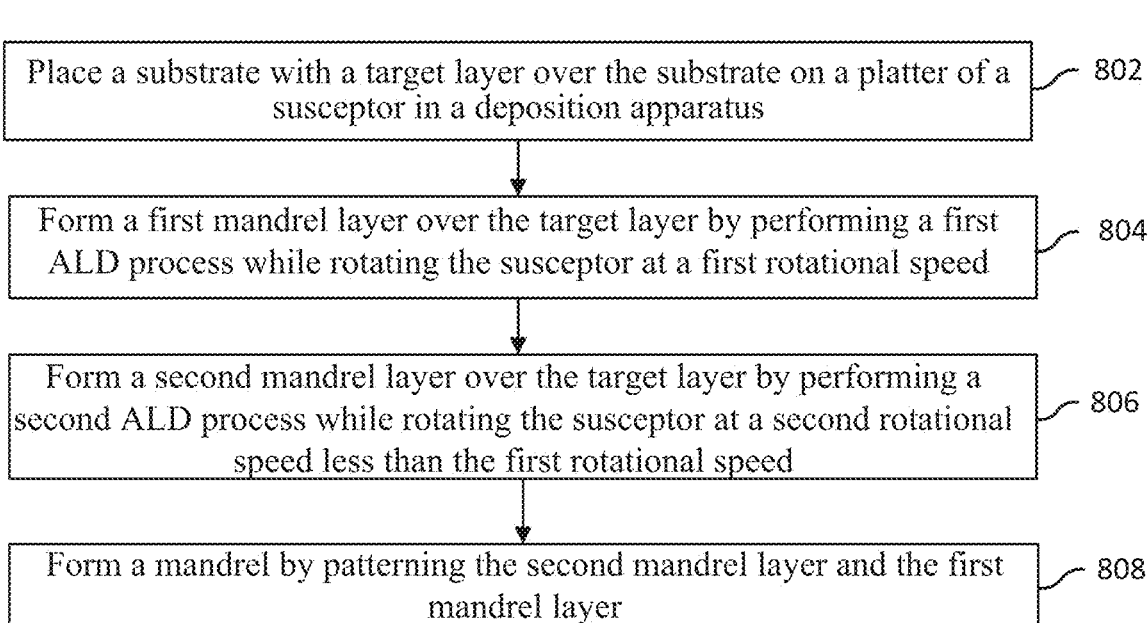

| Place a substrate with a target layer over the substrate on a platter of a susceptor in a deposition apparatus | 802 |

| Form a first mandrel layer over the target layer by performing a first ALD process while rotating the susceptor at a first rotational speed | 804 |

| Form a second mandrel layer over the target layer by performing a second ALD process while rotating the susceptor at a second rotational speed less than the first rotational speed | 806 |

| Form a mandrel by patterning the second mandrel layer and the first mandrel layer | 808 |

FIGURE 21

METHOD OF PROFILE CONTROL FOR SEMICONDUCTOR MANUFACTURING

TECHNICAL FIELD

The present invention relates generally to methods for patterning a layer on a substrate, and, in particular embodiments, to methods of forming semiconductor structures.

BACKGROUND

Generally, a semiconductor device, such as an integrated circuit (IC) is fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias) integrated in a monolithic structure. At each successive technology node, the minimum feature sizes are shrunk to reduce cost by roughly doubling the component packing density.

The various layers are generally patterned using a photolithography process. The substrate is first coated with a photoresist, and then exposed to a pattern of actinic radiation using a photolithography system. After exposure, a relief pattern is developed using a solvent that removes a portion of the photoresist layer. In a direct photolithography process the patterned photoresist is the etch mask used to transfer the pattern to underlying target layers. Here, the minimum feature size would be roughly the optical resolution of the photolithography system. Methods for improving the resolution limit of a photolithography system comprise using a shorter wavelength radiation source, for example, 193 nm ArF laser instead of 248 nm KrF laser, and increasing the numerical aperture (NA) by immersion photolithography, wherein the air in the region between the substrate and the system of lenses in the photolithography system is replaced by a medium with a higher refractive index such as water. However, it is extremely challenging to extend the resolution limit of an optical system below 38 nm.

Instead, multiple patterning techniques have been developed to print features at a pitch below the resolution limit of the photolithography system. By using these techniques, 193 nm immersion photolithography has been extended to create patterned layers having features at a pitch less than 30 nm. For example, in a simple double patterning pitch splitting method the target pattern may be split into two patterns, each having features at a pitch within the optical resolution limit. These two patterns may be combined to form a patterned mask having features at a sub-resolution pitch. The concern of overlay error in combining two patterns has led to the development of self-aligned pitch splitting techniques such as sidewall image transfer (SIT). The self-aligned double patterning with SIT (SADP-SIT) process uses the optical system just once to print a photoresist mask with features at the optical resolution limit. Then the SIT technique is used to form a layer with double the feature density. In the SIT technique, a sacrificial mandrel layer is patterned at the minimum pitch and sidewall spacers are formed around the mandrels. The mandrels are then removed selectively to leave a pattern of spacers at one-half the pitch of the resolution limit for the photolithography system. The half-pitch spacer pattern may be used as a masking layer to transfer the pattern to one or more underlying layers. This SADP-SIT process may also be repeated for self-aligned quadruple patterning (SAQP) to generate another spacer pattern at a quarter of the minimum pitch for the photolithography system.

The additional processing cost incurred with using multiple patterning to pattern a target layer may be a tolerable penalty for a semiconductor IC fabrication process flow in which sub-resolution features are needed at one or two critical levels. As techniques such as pitch splitting patterning using SIT are applied at an increasing number of patterning levels, innovative methods are useful for reducing the manufacturing cost.

SUMMARY

In accordance with an embodiment, a method of forming a semiconductor structure includes: forming a first mandrel layer over a target layer, the first mandrel layer having a first etch rate; forming a second mandrel layer over the first mandrel layer, the second mandrel layer having a second etch rate, the second etch rate being less than the first etch rate; forming a third mandrel layer over the second mandrel layer, the third mandrel layer having a third etch rate, the third etch rate being less than the second etch rate; and patterning a mandrel by etching the third mandrel layer, the second mandrel layer, and the first mandrel layer.

In accordance with another embodiment, a method of forming a semiconductor structure includes: forming a mandrel layer over a target layer of a substrate, the target layer being over the substrate, the mandrel layer including a composition gradient from a first surface of the mandrel layer to a second surface of the mandrel layer; patterning a mandrel from the mandrel layer, a profile shape of the mandrel being controlled by the composition gradient of the mandrel layer; forming a spacer on a sidewall of the mandrel; removing the mandrel to leave the spacer; and using the spacer as a mask to pattern the target layer.

In accordance with yet another embodiment, a method of forming a semiconductor structure includes: placing a substrate in a deposition apparatus on a platter of a susceptor, the susceptor being a part of the deposition apparatus, a target layer being over the substrate; forming a first mandrel layer over the target layer by performing a first atomic layer deposition (ALD) process while rotating the susceptor at a first rotational speed; forming a second mandrel layer over the target layer by performing a second ALD process while rotating the susceptor at a second rotational speed, the second rotational speed being less than the first rotational speed; and forming a mandrel by patterning the second mandrel layer and the first mandrel layer.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIG. 19 illustrates a flow chart for a method of forming a semiconductor structure;

FIG. 20 illustrates a flow chart for another method of forming a semiconductor structure; and FIG. 21 illustrates a flow chart for yet another method of forming a semiconductor structure.

Figure 1:
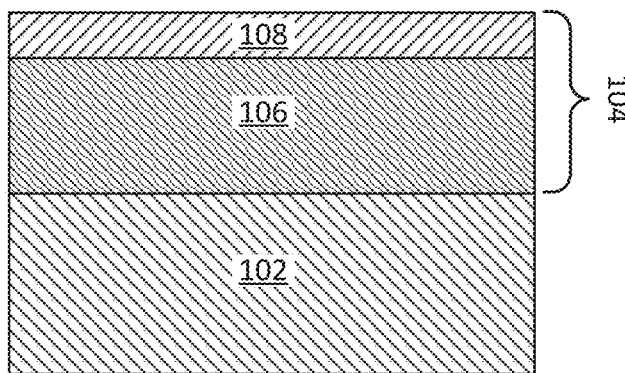
FIGS. 1 and 2 illustrate cross-sectional views of a semiconductor structure at various intermediate stages of fabrication, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

This disclosure describes a pitch splitting, self-aligned double patterning (SADP) process flow utilizing innovative sidewall image transfer (SIT) methods. The methods are equally applicable to other multiple patterning processes using SIT; for example, self-aligned quadruple patterning (SAQP) process using SIT. As known to persons skilled in the art, multiple patterning techniques (e.g., SADP-SIT/SAQP-SIT) used in IC fabrication add process steps and complexity in order to enable patterning of layers with sub-resolution features; for example, an array of parallel lines printed at a pitch that is one-half of the minimum pitch of the photolithography system using, for example, SADP-SIT, or one-quarter of the minimum pitch of the photolithography system using, for example, SAQP with SIT. The SIT technique generally comprises first patterning an array of mandrels arranged in a pitch at the resolution limit of the photolithography system, followed by forming self-aligned spacers on the sidewalls of the mandrels, and then selectively pulling the mandrels, thereby printing an array of spacers with double the number of lines than the number of mandrel lines in the initial array from which the spacer pattern was formed. Accordingly, the spacer pattern has a pitch that is one-half times the minimum pitch of the photolithography system. Repeating this process would quadruple the pattern density and provide a new spacer pattern achieving one-quarter times the minimum pitch of the photolithography system.

According to one or more embodiments of the present disclosure, this application relates to methods of forming layers for mandrels and/or hardmasks that may improve etch performance and resulting pattern shape by profile control of the mandrels and/or hardmasks (e.g., controlling the profile of mandrels to reduce tapering). The mandrel layers may have multiple layers with different etch selectivities with respect to each other, with a top layer configured to reduce or eliminate a tapering shape of the subsequently formed mandrels and a bottom layer configured to reduce or prevent footing at the respective bases of the mandrels and gouging of the underlying material or substrate. Reducing or preventing a tapering shape of the mandrels and reducing or preventing footing and gouging may be advantageous for improving the subsequent pattern shapes formed using the mandrels, e.g., to form self-aligned spacers used as a mask in a subsequent etch process.

The mandrel layers may also include layers having varying composition gradients configured to modulate the profiles of the subsequently formed mandrels. The mandrel layers with different etch selectivities and/or different composition gradients of the mandrel layers may be formed by varying rotation rates of susceptors and/or changing amounts or densities of precursors supplied to a process chamber during atomic layer deposition (ALD) processes. Variation of the composition of the mandrel layer(s) may include varying defectivity, crystallinity, and density of impurities in the mandrel layer(s). Controlling etch chemistry and temperature during the etch process may be useful for controlling the profile of trenches etched through a layer, for example by producing trenches with straighter sidewalls. In some embodiments, a chemical vapor deposition (CVD) process is used to deposit a lower amount of material over a layer while protecting sidewalls of a trench into the layer during a subsequent etching process.

Embodiments of the disclosure are described in the context of the accompanying drawings. Embodiments of example fabrication processes including formation and patterning of mandrel layers will be described using FIGS. 1-9. Additional embodiments of other example formations and patterning of mandrel layers will be described using FIGS. 10-11, 12-13, 14-15, and 16-17. Embodiments of an apparatus and methods of performing deposition processes will be described using FIG. 18. Embodiments of methods for forming semiconductor structures will be described using FIGS. 19, 20, and 21.

FIG. 1 illustrates a cross-sectional view of a semiconductor structure 100, in accordance with some embodiments. The semiconductor structure 100 includes a substrate 102 and a target layer 104 over the substrate 102. In some embodiments, the substrate 102 may be a silicon wafer, or a silicon-on-insulator (SOI) wafer. In certain embodiments, the substrate 102 may comprise a silicon germanium wafer, silicon carbide wafer, gallium arsenide wafer, gallium nitride wafer and other compound semiconductors. In other embodiments, the substrate 102 comprises heterogeneous layers such as silicon germanium on silicon, gallium nitride on silicon, silicon carbon on silicon, as well layers of silicon on a silicon or SOI substrate. In various embodiments, the substrate 102 is patterned or embedded in other components of the semiconductor device. In various embodiments, the substrate 102 may be a part of a semiconductor device, and may have undergone a number of steps of processing following, for example, a conventional process. The substrate 102 accordingly may comprise layers of semiconductors useful in various microelectronics. For example, the semiconductor structure 100 may comprise a substrate 102 in which various device regions are formed.

In some embodiments, the target layer 104 includes a dielectric layer 106 and a hardmask layer 108. The dielectric layer 106 is formed over the substrate 102 and the hardmask layer 108 is formed over the dielectric layer 106. The dielectric layer 106 is the layer to be patterned using the hardmask layer 108 as an etch mask, after the hardmask layer 108 has been patterned using a self-aligned double-patterning technique, as described in further detail below. After being patterned, a metallization pattern is formed in trenches through the dielectric layer 106 (see below, FIGS. 8-9). In some embodiments, the dielectric layer 106 is a silicon-based dielectric material with a low dielectric constant (i.e., low-k value) such as organosilicate glass (Si-COH), dense SiCOH, porous SiCOH, and other porous dielectric materials. In some embodiments, the hardmask layer 108 comprises titanium nitride, titanium, titanium oxide, tantalum, tungsten carbide, other tungsten based compounds, ruthenium based compounds, aluminum based compounds, amorphous silicon, silicon nitride, silicon carbide, or the like. However, any suitable materials may be used for the dielectric layer 106 and the hardmask layer 108.

Figure 2:
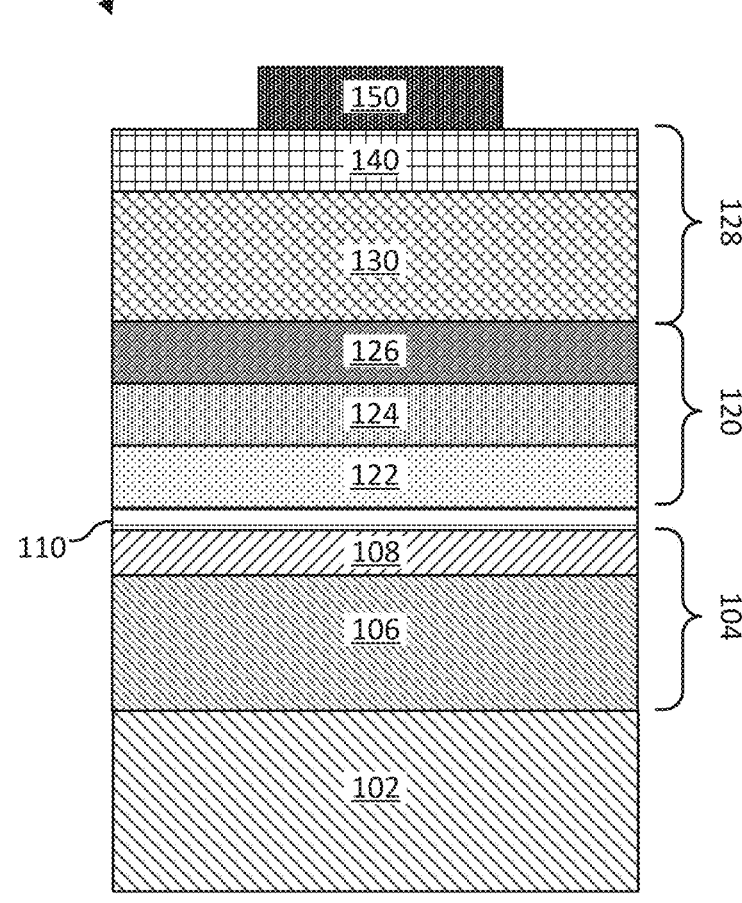

In FIG. 2, a mandrel layer 120, a lithography stack 128, and a patterned resist 150 are formed over the target layer 104. The patterned resist 150 and the lithography stack 128 are subsequently used to pattern the mandrel layer 120 and form mandrels (see below, FIGS. 3A-3B). In some embodiments, a cover layer 110 is formed over the target layer 104 prior to forming the mandrel layer 120, and the mandrel layer 120 is formed over the cover layer 110.

In various embodiments, the cover layer 110 is formed over the target layer 104 with a spin-on process and comprises spin-on glass (SOG). In other embodiments, the cover layer 110 comprises materials formed using CVD such as silicon oxynitride ($SiO_xN_y$), silicon dioxide, silicon nitride, silicon carbide, metal oxide, the like, or a combination thereof. The cover layer 110 may reduce or prevent gouging of the underlying target layer 104 during a subsequent patterning of the mandrel layer 120 (see below, FIGS. 3A-3B).

Next, the mandrel layer 120 is formed over the target layer 104 and the cover layer 110 if present. The mandrel layer 120 will be subsequently patterned to form mandrels 121 (see below, FIGS. 3A-3B). It should be understood that the disclosure refers to mandrel layers and mandrels as a non-limiting examples, and methods in which hardmask layers are patterned to form hardmasks by the same methods are within the scope of the disclosed embodiments. In some embodiments, the mandrel layer 120 comprises silicon oxide, silicon dioxide, silicon nitride, amorphous silicon, aluminum oxide, aluminum nitride, titanium oxide, titanium silicon oxide, amorphous carbon, metal oxide, metal nitride, metal, thermal oxide, any other type of sacrificial material known within the art, or a combination thereof. The mandrel layer 120 may also compromise a plasma polymerized organic film, spin on film, or dielectric film. In various embodiments, the mandrel layer 120 comprises multiple layers, such as a first layer 122, a second layer 124 over the first layer 122, and a third layer 126 over the second layer 124. However, the mandrel layer 120 may comprise any suitable number of layers, such as one to ten layers, or one to five layers. In some embodiments, the mandrel layer 120 and the layers it comprises (e.g., the first layer 122, the second layer 124, and the third layer 126) are formed with chemical vapor deposition (CVD), atomic layer deposition (ALD), a spin-on technique, the like, or a combination thereof.

In various embodiments, layers of the mandrel layer 120 are formed to have different etch rates with respect to a subsequent etch process in order to tune the profile of a subsequently patterned mandrel. For example, the first layer 122 is formed to have a first etch rate with respect to a subsequent etch process, the second layer 124 is formed to have a second etch rate with respect to the subsequent etch process, and the third layer 126 is formed to have a third etch rate with respect to the subsequent etch process. The second etch rate may be less than the first etch rate and the third etch rate may be less than the second etch rate. This may be advantageous for reducing or eliminate a tapering shape of the subsequently patterned mandrel and reducing or preventing footing at the respective base of the mandrels and gouging of the underlying material (e.g., the cover layer 110 or the target layer 104). The respective etch rates of the layers of the mandrel layer 120 may be tuned by forming the layers of the mandrel layer 120 with different respective materials, by adjusting the relative concentrations of elements in the layers of the mandrel layer 120, or a combination thereof. As an example, the first layer 122 comprises silicon oxide, the second layer 124 comprises silicon oxynitride, and the third layer 126 comprises silicon nitride. As another example, the first layer 122, the second layer 124, and the third layer 126 comprise silicon oxide with the second layer 124 having a higher concentration of silicon than the first layer 122 and the third layer 126 having a higher concentration of silicon than the second layer 124.

The mandrel layer 120 may also include one or more layer(s) having varying composition gradients configured to modulate the profiles of the subsequently formed mandrel (see below, FIGS. 10-17). Mandrel layers with different etch selectivities (e.g., the first layer 122, the second layer 124, and the third layer 126) and/or different composition gradients of the one or more mandrel layer(s) may be formed by varying rotation rates of susceptors and/or changing amounts or densities of precursors supplied to a process chamber during atomic layer deposition (ALD) processes (see below, FIG. 18). The mandrel layer 120 may include varying defectivity, crystallinity, and density of impurities.

A lithography stack 128 is formed over the mandrel layer 120. As illustrated in FIG. 2, the lithography stack 128 comprises a planarizing layer 130 over the mandrel layer 120 and an antireflective coating 140 over the planarizing layer 130. In some embodiments, the planarizing layer 130 comprises spin-on carbon (SOC), an organic planarizing layer (OPL), amorphous carbon, or the like. In some embodiments, the antireflective coating 140 comprises a bottom antireflective coating (BARC) such as a silicon antireflective coating (SiARC), an organic BARC, SiC, spin-on glass (SOG), silicon, silicon oxide, silicon nitride, or the like. However, any suitable materials may be used for the planarizing layer 130 and the antireflective coating 140.

A patterned resist 150 is formed over the lithography stack 128. The patterned resist 150 is used for the subsequent patterning of the mandrel layer 120 (see below, FIGS. 3A-3B). In some embodiments, the patterned resist 150 is a metal oxide resist that is exposed with extreme ultraviolet (EUV) radiation and developed with a wet etch selective to either exposed or unexposed regions of the metal oxide resist. However, any suitable photoresist, exposure method, and development method may be used to form the patterned resist 150.

Figure 3A:
FIG. 3A illustrates a cross-sectional view of a semiconductor structure at an intermediate stage of fabrication, in accordance with some embodiments.
Figure 3A:
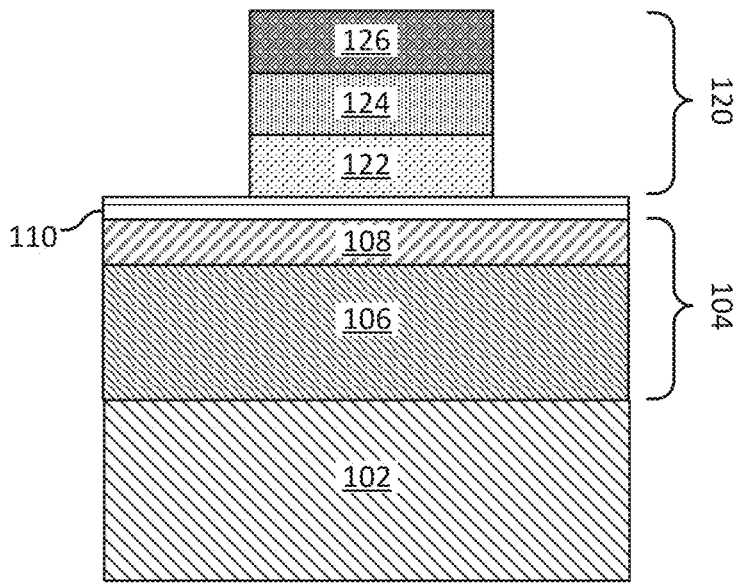
Figure 3B:
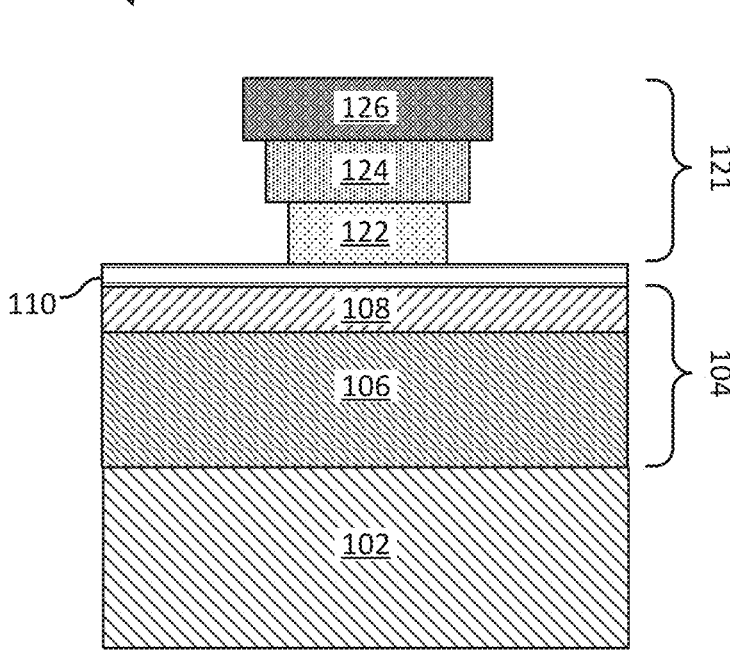
FIG. 3B illustrates a cross-sectional view of a semiconductor structure at an intermediate stage of fabrication, in accordance with some other embodiments.

FIGS. 3A and 3B illustrate a patterning of the mandrel layer 120 (see above, FIG. 2) to form a mandrel 121, in accordance with some embodiments. FIG. 3A illustrates an embodiment in which the sidewalls of the first layer 122, the second layer 124, and the third layer 126 are aligned in the mandrel 121 after the patterning, and FIG. 3B illustrates an embodiment in which the third layer 126 is wider than the second layer 124 and the second layer 124 is wider than the first layer 122 after the patterning.

The mandrel layer 120 (see above, FIG. 2) is patterned to form a mandrel 121 in embodiments illustrated in both FIGS. 3A and 3B. In some embodiments, the mandrel 121 is formed with a multi-step etch process. For example, the patterned resist 150 (see above, FIG. 2) may be used as an etch mask to pattern a portion of the lithography stack 128 (see above, FIG. 2). The patterned portion of the lithography stack 128 is then used as an etch mask to etch the remaining portion of the lithography stack 128. Next, the remaining portion of the lithography stack 128 is used as an etch mask in an etching process to form the mandrel 121. After patterning the mandrel 121, the remaining portions of the lithography stack 128 and the patterned resist 150 are removed with a suitable process, such as a CMP or the like.

The etching process to form the mandrel 121 may be a wet etch, a dry etch, or a combination thereof. In some embodiments, the etching process includes a wet etch performed with dilute hydrofluoric acid, a mixture of hydrochloric acid and hydrogen peroxide, dilute hydrochloric acid, an organic alkali, sulfuric acid, the like, or a combination thereof. The wet etch may be performed at a temperature in a range of room temperature (e.g., 25° C.) to 120° C., such as room temperature, 60° C., 70° C., or 120° C.

In some embodiments, the etching process includes a dry etch (e.g., a reactive ion etch) performed with oxygen ($O_2$), nitrogen ($N_2$), hydrogen ($H_2$), a mixture of nitrogen and hydrogen ($N_2/H_2$), a mixture of nitrogen, oxygen, and hydrogen ($N_2/O_2/H_2$), a fluorine-containing gas (e.g., $CF_4$, $C_4F_6$, $C_4F_8$, $CH_2F_2$, $CH_3F$, $CHF_3$), a chlorine-based or bromine-based gas ($Cl_2$, HBr), the like, or a combination thereof. In some embodiments, the dry etch is performed at a cryogenic temperature in a range of −70° C. to 150° C., which may be useful for controlling the profile of the etched feature (e.g., a trench) in order to form straighter sidewalls. This may be due to the temperature dependence of reaction rates as given by the Arrhenius equation:

$$k_c = A\exp\left(-\frac{E_a}{RT}\right),$$

where $k_c$ is the rate constant, A is the pre-exponential factor, $E_a$ is the activation energy for the reaction, R is the universal gas constant, and T is the absolute temperature. In embodiments where the dry etch comprises $N_2/H_2$, the nitrogen may react to form organic layers, such as carbon-nitrogen (C—N) layers, on vertical sidewalls of the trench. This can provide a good balance between a high etch rate and sidewall protection that reduces etching in a horizontal direction and produces a greater degree of anisotropy in the etched feature (e.g., straighter sidewalls of a trench).

In some embodiments, the etch process further includes a deposition step between etching steps. For example, one cycle of the etch process may include a first etch step (e.g., a reactive ion etch), a deposition step (e.g., a chemical vapor deposition (CVD) of a silicon-based material), an oxidation step, and a second etch step. Organic etch byproducts resulting from the etch step, the deposition, and the oxidation may effectively protect sidewalls of the etched feature (e.g., a trench) so that less excess deposition on a top of the structure occurs during the cycle. In some embodiments, the first etch step is performed for 30 seconds, the deposition step is performed for 5 seconds, the oxidation step is performed for 10 seconds, and the second etch step is performed for 10 seconds. The etch process may be repeated for any suitable number of cycles, such as 15 cycles.

Figure 3C:
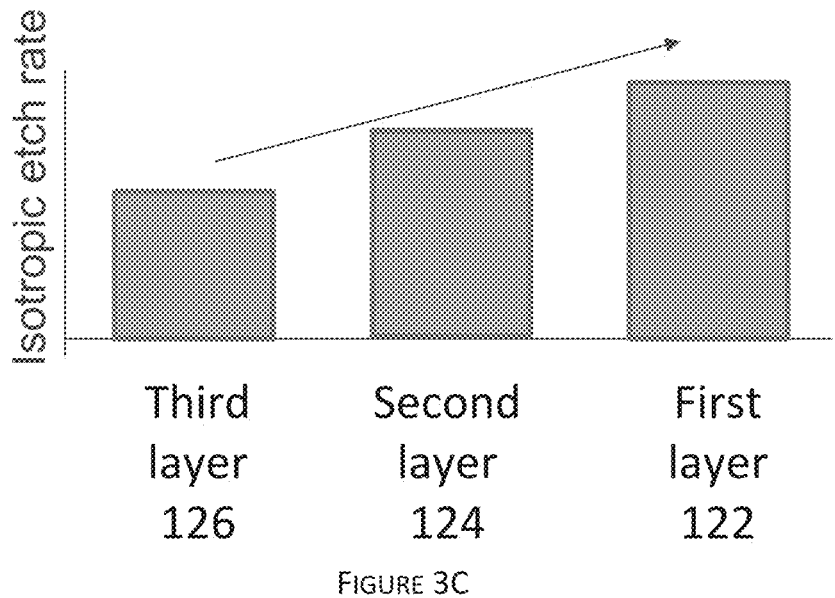
FIG. 3C is a graph showing relative etch rates of various layers, in accordance with some embodiments.

FIG. 3C is a graph showing the relative isotropic etch rates of the first layer 122, the second layer 124, and the third layer 126. As shown, the first layer 122 has a higher isotropic etch rate than the second layer 124, and the second layer 124 has a higher isotropic etch rate than the third layer 126. After the patterning of the mandrel layer 120 to form the mandrel 121, this relative difference in isotropic etch rates may produce a profile of the mandrel 121 as shown in FIG. 3A or FIG. 3B and avoid tapering of the profile of the mandrel 121 (in which the top surface of the mandrel 121 is smaller than the bottom surface). The etch rates of the first layer 122, the second layer 124, and the third layer 126 may be chosen to produce a desired profile, such as a profile in which the sidewalls of the first layer 122, the second layer 124, and the third layer 126 are aligned in the mandrel 121 as illustrated by FIG. 3A, or a profile in which the third layer 126 is wider than the second layer 124 and the second layer 124 is wider than the first layer 122 as illustrated by FIG. 3B.

In some embodiments, the first layer 122 is the bottommost layer of the mandrel layer 120 and has a higher etch rate than layers of the mandrel layer 120 above it (e.g., the second layer 124 and the third layer 126) in order to reduce or prevent footing on the profile of the mandrel 121. Footing may be reduced or prevented by increasing the isotropic etch rate of the bottommost layer (e.g., the first layer 122). The etch rate can be controlled by the material composition of the bottommost layer and the corresponding etching condition. Reducing or preventing footing may be advantageous for improving the subsequent pattern shapes formed using the mandrel 121, e.g., forming self-aligned spacers (see below, FIGS. 4-5) that used as a mask in a subsequent etch process.

The first layer 122 may also have a higher etch rate than an etch rate of the underlying material (e.g., the cover layer 110, if present), which may be useful for reducing gouging of the underlying material. In some embodiments (e.g., embodiments in which the first layer 122 comprises amorphous silicon and the cover layer 110 comprises silicon nitride), the gouging may be reduced to a depth of less than 3 nm, such as less than 1 nm.

In some embodiments, the third layer 126 is the topmost layer of the mandrel layer 120 and has a lower etch rate than layers of the mandrel layer 120 below it (e.g., the first layer 122 and the second layer 124) in order to tapering of the profile of the mandrel 121. Reducing or preventing a tapering shape of the profile of the mandrel 121 may be advantageous for improving the subsequent pattern shapes formed using the mandrel 121, e.g., forming self-aligned spacers (see below, FIGS. 4-5) used as a mask in a subsequent etch process.

It should be appreciated that embodiments illustrated by FIGS. 2-3B are non-limiting examples showing possible configurations of mandrel layers with different etch rates.

Any suitable numbers of mandrel layers with different etch rates and resulting mandrel profiles are within the scope of the disclosed embodiments.

Figure 4:
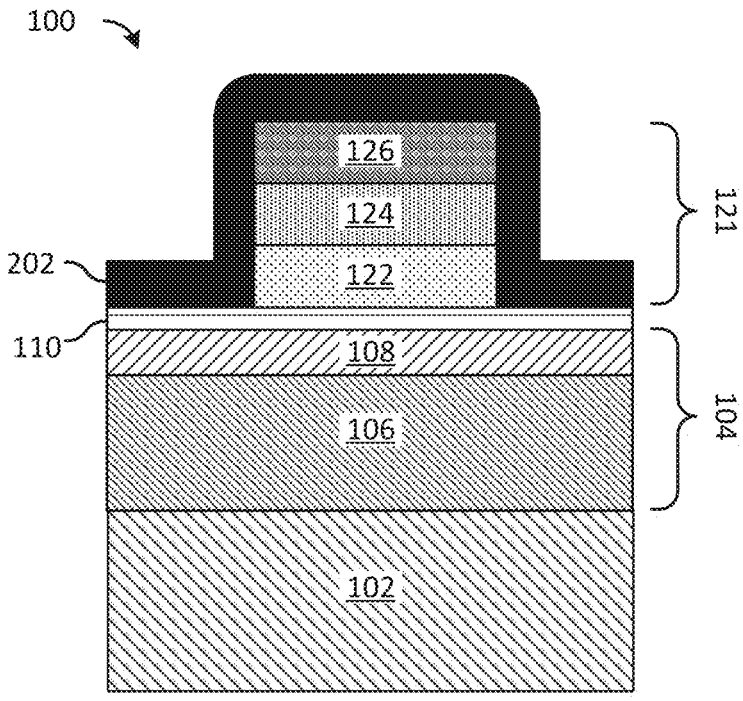
FIGS. 4 through 9 illustrate cross-sectional views of a semiconductor structure at various intermediate stages of fabrication, in accordance with some embodiments.

In FIG. 4, following from FIG. 3A, a spacer layer 202 is formed conformally over a top surface and along sidewalls of the mandrel 121 and a top surface of the exposed cover layer 110 (if present). The spacer layer 202 may be formed with a suitable process such as ALD or the like. In some embodiments, the spacer material is an oxide or nitride such as silicon oxide, silicon nitride, titanium nitride, titanium oxide, zirconium oxide, or the like. The spacer material is different from the material of the mandrel 121 so that a subsequent etch may be selective to the mandrel 121 over the spacers 204 (see below, FIG. 5).

Figure 5:
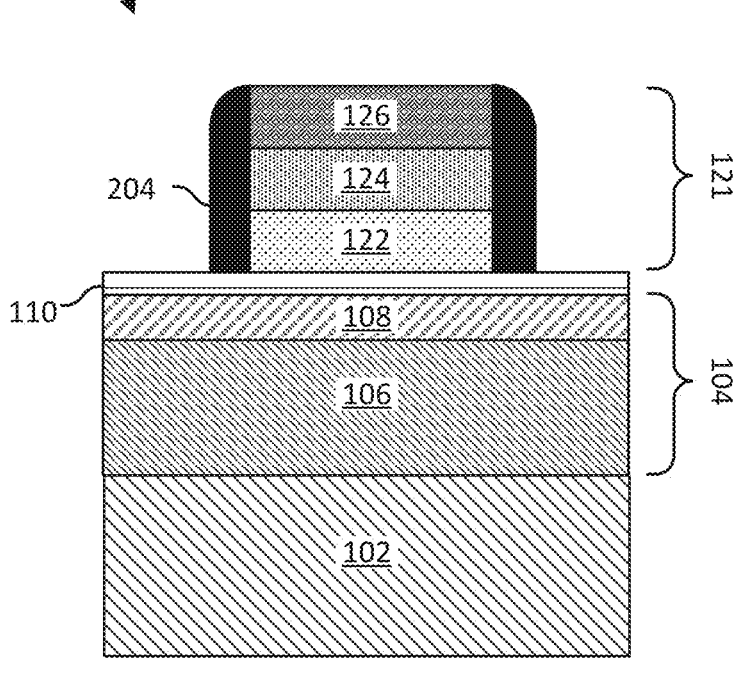

FIG. 5 illustrates the semiconductor structure 100 of FIG. 4 after a directional etch has been performed to remove portions of the spacer layer 202 selectively from over the roughly flat top surfaces of the mandrel 121 and the cover layer 110 (if present), forming sidewall spacers 204. The edge profiles of the spacers 204 reflect the tapered sidewall profiles of the respective mandrels 121. The spacer layer 202 is selectively etched using an anisotropic etching technique (e.g., a reactive ion etch (RIE)) that clears the top of the mandrel 121 to form the spacers 204.

Figure 6:
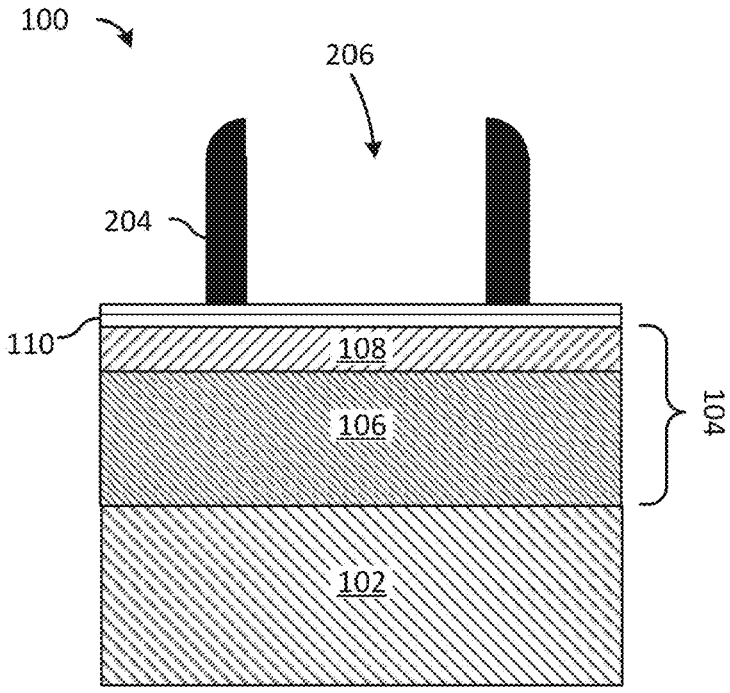

In FIG. 6, the mandrel 121 (see above, FIG. 5) is selectively removed by a suitable mandrel pull etch process, leaving a space 206 in the region occupied by the mandrel 121. The mandrel pull etch process may be performed with a suitable wet process, dry process (e.g., a reactive ion etch or the like using anisotropic plasma etching), or a combination thereof. A half-pitch spacer pattern comprising free-standing spacers 240 may remain over the underlying structure (e.g., the cover layer 110 if present or the target layer 104). The edges of a pair of freestanding spacers 204 reflect the edges of the respective mandrel 121 that was separated from the pair.

Figure 7:
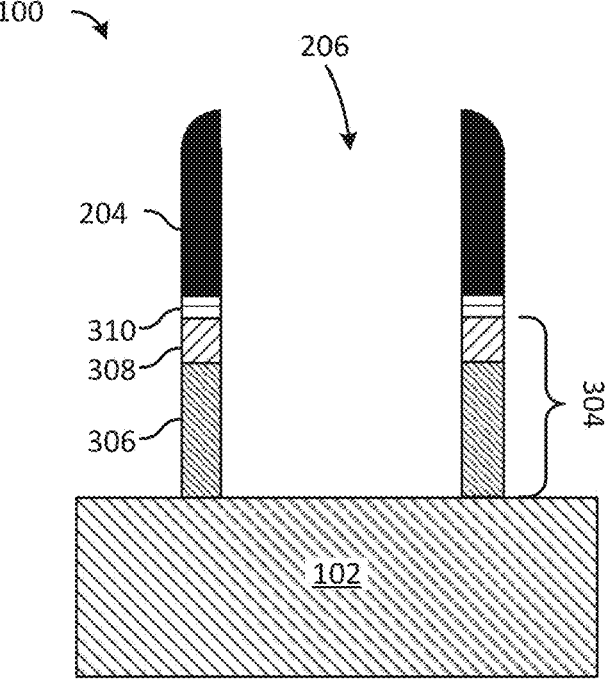

In FIG. 7, the target layer 104 is patterned in order to subsequently form a metallization pattern (see below, FIG. 9). The spacers 204 are used as an etching mask in an etching process (e.g., a wet or dry process) to extend the space 206 through the cover layer 110 (if present) and the target layer 104. After the etching process, a patterned target layer 304 remains under the spacers 204. In some embodiments, a patterned cover layer 310 is between the patterned target layer 304 and the spacers 204. In some embodiments, the patterned target layer 304 comprises a patterned dielectric layer 306 and a patterned hardmask layer 308 on the patterned dielectric layer 306.

Figure 8:
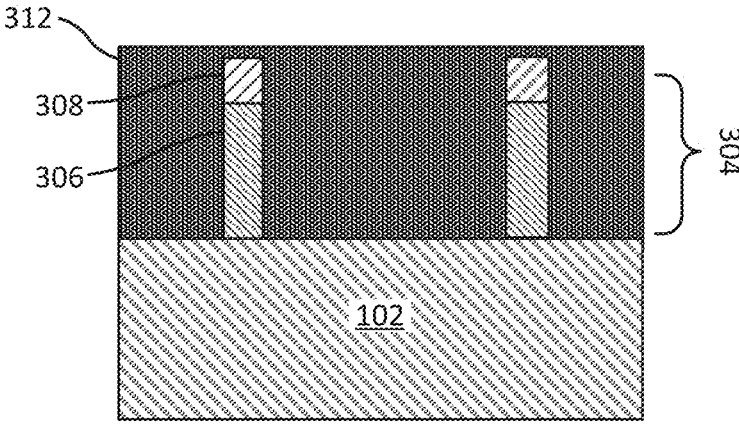

In FIG. 8, a conductive material 312 is formed over the semiconductor structure 100 to fill spaces between portions of the patterned target layer 304. In some embodiments, prior to forming the conductive material 312, the spacers 204 and the patterned cover layer 310 (if present) are removed with a suitable process, e.g. a CMP. The conductive material 312 may be copper formed using electroplating. However, any suitable conductive material (e.g., tungsten, cobalt, ruthenium, the like, or a combination thereof) and deposition method (e.g., ALD, PVD, or the like) may be used.

Figure 9:
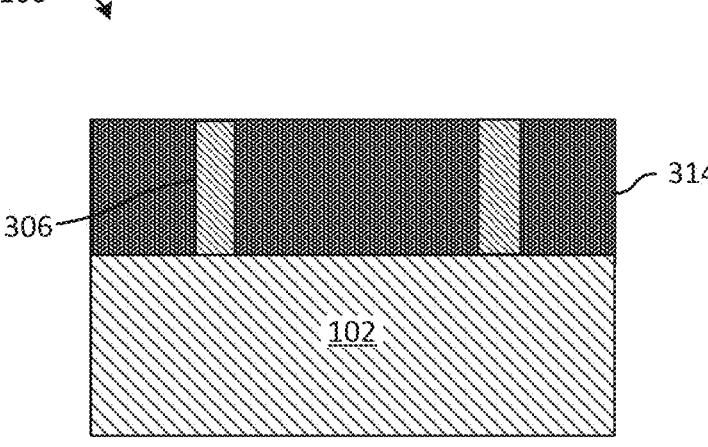

In FIG. 9, excess conductive material 312 formed over a top surface of the patterned target layer 304 is removed with a suitable process, e.g. a CMP, to form a metallization pattern 314. In some embodiments, the patterned hardmask layer 308 is also removed, leaving the metallization pattern 314 between remaining portions of the patterned dielectric layer 306. The shape of the metallization pattern 314 may be improved by controlling the profile shape of the mandrel 121 in earlier patterning steps (see above, FIG. 5).

Figure 10:
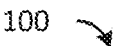
FIGS. 10 and 11 illustrate cross-sectional views of a semiconductor structure at various intermediate stages of fabrication, in accordance with some other embodiments.
Figure 10:
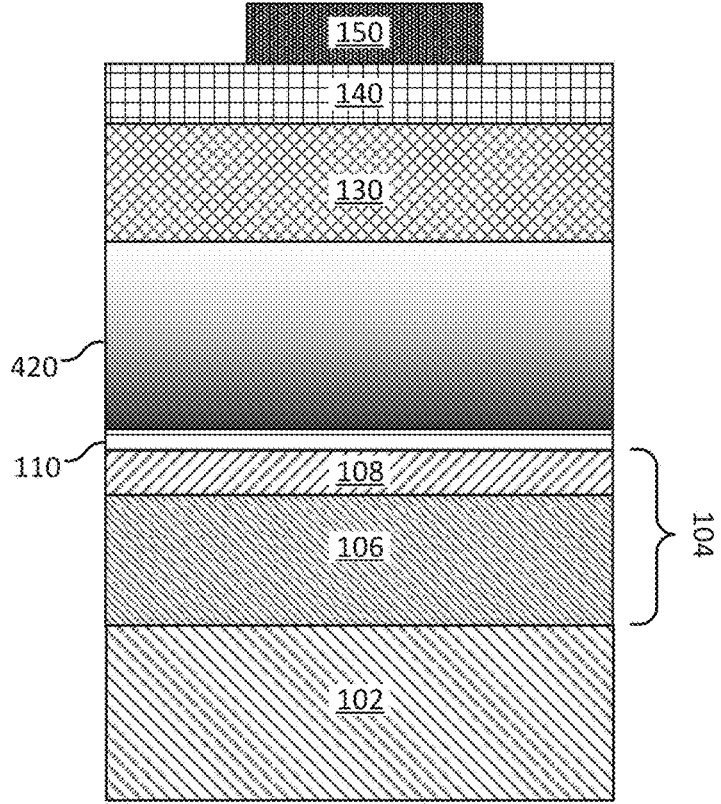

FIGS. 10-17 illustrate other embodiments in which single mandrel layers are formed with gradient composition differences to modulate resulting profiles of subsequently formed mandrels. Mandrels formed in FIGS. 10-17 may be subsequently used to form metallization patterns using process steps similar to those described above with respect to FIGS. 4-9. FIG. 10 illustrates a semiconductor structure 100 similar to the semiconductor structure 100 shown above in FIG. 2 but with a single mandrel layer 420 having a composition gradient instead of a mandrel layer 120 comprising three different layers. The mandrel layer 420 has a gradient of a species that varies from a lower concentration at a top surface of the mandrel layer 420 to a higher concentration at a bottom surface of the mandrel layer 420.

In various embodiments, the mandrel layer 420 comprises silicon dioxide ($SiO_2$), amorphous silicon, titanium oxide, aluminum oxide, or the like, and the species is an element such as nitrogen, silicon, or the like. As a first example, the mandrel layer 420 comprises silicon dioxide or amorphous silicon and the species is nitrogen that varies from a lower concentration of nitrogen at a top surface of the mandrel layer 420 to a higher concentration of nitrogen at a bottom surface of the mandrel layer 420. As a second example, the mandrel layer 420 comprises titanium oxide or aluminum oxide and the species is silicon that varies from a lower concentration of silicon at a top surface of the mandrel layer 420 to a higher concentration of silicon at a bottom surface of the mandrel layer 420. This may result in the etch rate of the mandrel layer 420 varying from a higher etch rate at the top surface of the mandrel layer 420 to a lower etch rate at the bottom surface of the mandrel layer 420.

Figure 11:
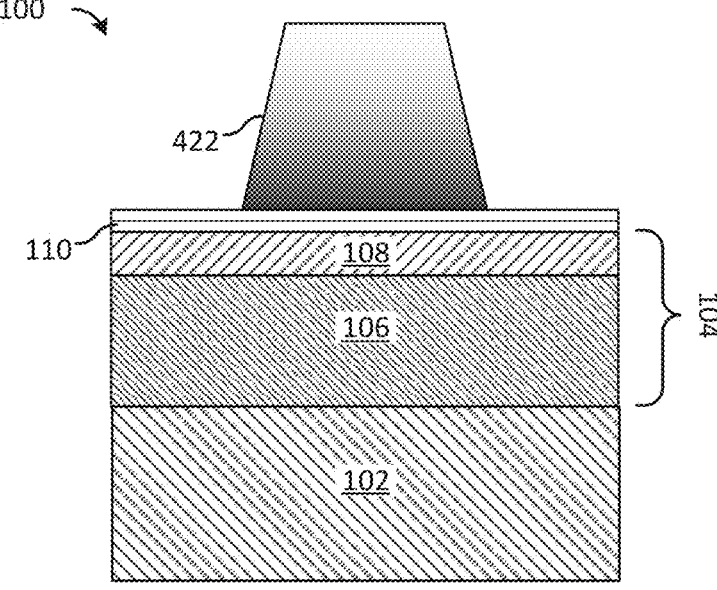

FIG. 11 follows from FIG. 10 and shows a mandrel 422 patterned from the mandrel layer 420. The mandrel 422 may be patterned from the mandrel layer 420 with similar methods as described above for the mandrel 121 with respect to FIGS. 3A-3B. The mandrel 422 has a trapezoidal profile in a cross-sectional view with a narrower top surface and a broader bottom surface, which may be due to the gradient of density for a species (e.g., nitrogen or silicon) in the mandrel layer 420 increasing from the top surface of the mandrel layer 420 to the bottom surface of the mandrel layer 420.

Figure 12:
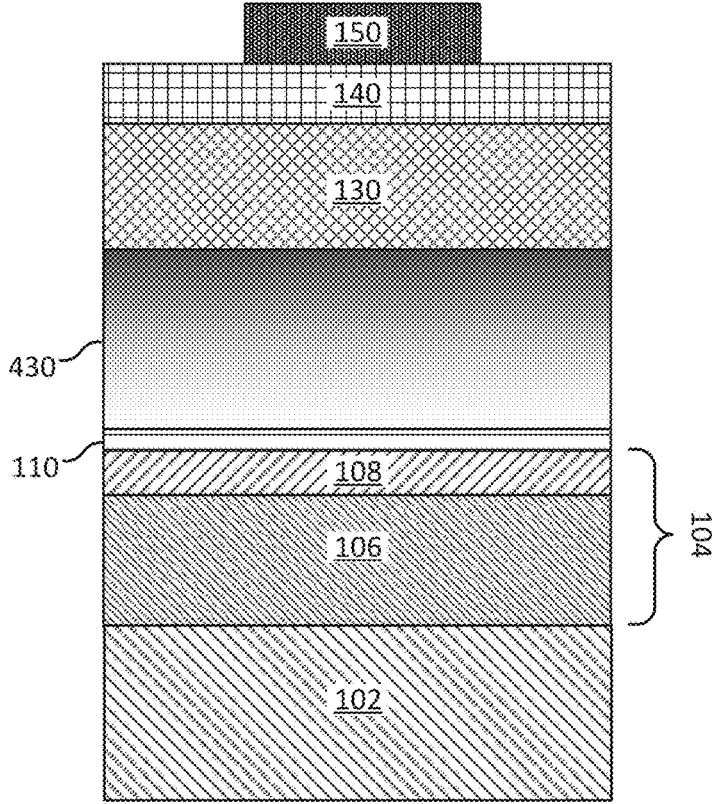
FIGS. 12 and 13 illustrate cross-sectional views of a semiconductor structure at various intermediate stages of fabrication, in accordance with some other embodiments.

FIG. 12 illustrates another embodiment of a semiconductor structure 100 with a mandrel layer 430 having a different composition gradient from the mandrel layer 420 (see above, FIG. 10). The mandrel layer 430 has a gradient of a species that varies from a higher concentration at a top surface of the mandrel layer 430 to a lower concentration at a bottom surface of the mandrel layer 430.

In various embodiments, the mandrel layer 430 comprises silicon dioxide ($SiO_2$), amorphous silicon, titanium oxide, aluminum oxide, or the like, and the species is an element such as nitrogen, silicon, or the like. As a first example, the mandrel layer 430 comprises silicon dioxide or amorphous silicon and the species is nitrogen that varies from a higher concentration of nitrogen at a top surface of the mandrel layer 430 to a lower concentration of nitrogen at a bottom surface of the mandrel layer 430. As a second example, the mandrel layer 430 comprises titanium oxide or aluminum oxide and the species is silicon that varies from a higher concentration of silicon at a top surface of the mandrel layer 430 to a lower concentration of silicon at a bottom surface of the mandrel layer 430. This may result in the etch rate of the mandrel layer 430 varying from a lower etch rate at the top surface of the mandrel layer 430 to a higher etch rate at the bottom surface of the mandrel layer 430.

Figure 13:
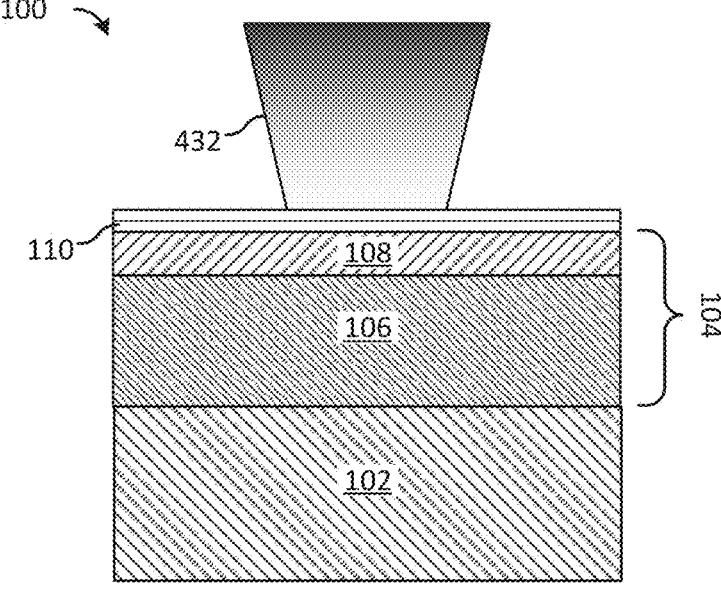

FIG. 13 follows from FIG. 12 and shows a mandrel 432 patterned from the mandrel layer 430. The mandrel 432 may be patterned from the mandrel layer 430 with similar methods as described above for the mandrel 121 with respect to FIGS. 3A-3B. The mandrel 432 has a trapezoidal profile in a cross-sectional view with a broader top surface and a narrower bottom surface, which may be due to the gradient of density for a species (e.g., nitrogen or silicon) in the mandrel layer 430 decreasing from the top surface of the mandrel layer 430 to the bottom surface of the mandrel layer 430.

Figure 14:
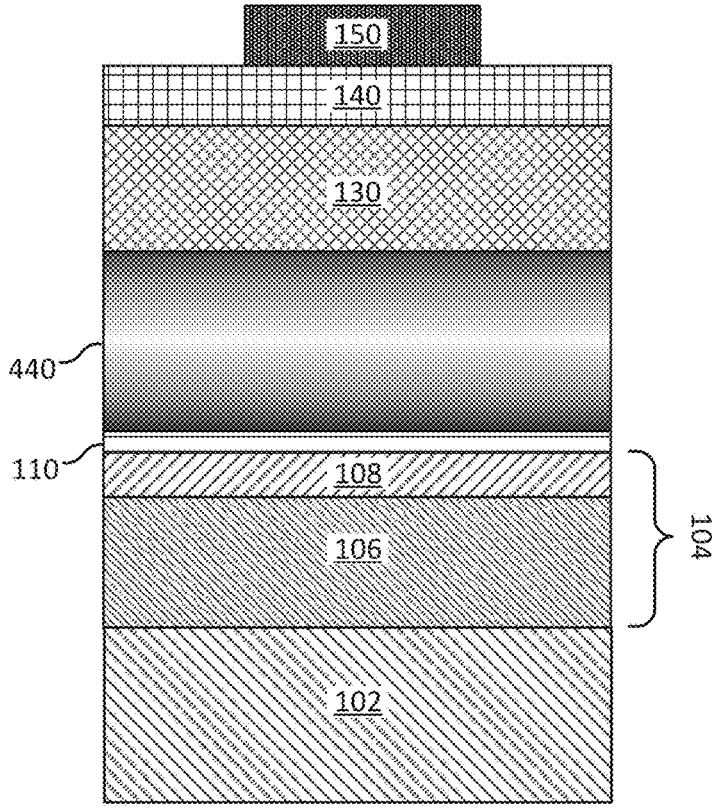
FIGS. 14 and 15 illustrate cross-sectional views of a semiconductor structure at various intermediate stages of fabrication, in accordance with some other embodiments.

FIG. 14 illustrates another embodiment of a semiconductor structure 100 with a mandrel layer 440 having a varying composition gradient. The mandrel layer 440 has a gradient of a species that varies from a higher concentration at a top surface of the mandrel layer 440 to a lower concentration near a midline of the mandrel layer 440 and back to a higher concentration at a bottom surface of the mandrel layer 440.

In various embodiments, the mandrel layer 440 comprises silicon dioxide ($SiO_2$), amorphous silicon, titanium oxide, aluminum oxide, or the like, and the species is an element such as nitrogen, silicon, or the like. As a first example, the mandrel layer 440 comprises silicon dioxide or amorphous silicon and the species is nitrogen that varies from a higher concentration of nitrogen at a top surface of the mandrel layer 440 to a lower concentration of nitrogen at a midline of the mandrel layer 440 and back to a higher concentration of nitrogen at a bottom surface of the mandrel layer 440. As a second example, the mandrel layer 440 comprises titanium oxide or aluminum oxide and the species is silicon that varies from a higher concentration of silicon at a top surface of the mandrel layer 440 to a lower concentration of silicon at a midline of the mandrel layer 440 and back to a higher concentration of silicon at a bottom surface of the mandrel layer 440. This may result in the etch rate of the mandrel layer 440 varying from a lower etch rate at the top surface of the mandrel layer 440 to a higher etch rate at the midline of the mandrel layer 440 and back to a lower etch rate at the bottom surface of the mandrel layer 440.

Figure 15:
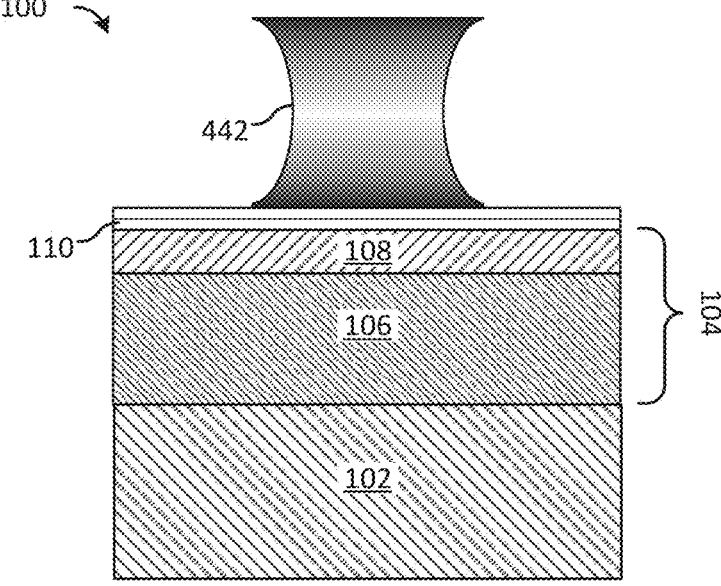

FIG. 15 follows from FIG. 14 and shows a mandrel 442 patterned from the mandrel layer 440. The mandrel 442 may be patterned from the mandrel layer 440 with similar methods as described above for the mandrel 121 with respect to FIGS. 3A-3B. The mandrel 442 has an hourglass-shaped profile in a cross-sectional view with concave sidewalls between the top surface and the bottom surface, which may be due to the gradient of density for a species (e.g., nitrogen or silicon) in the mandrel layer 440, decreasing from the top surface of the mandrel layer 440 to the midline of the mandrel layer 440, and then increasing from the midline of the mandrel layer 440 to the bottom surface of the mandrel layer 440.

Figure 16:
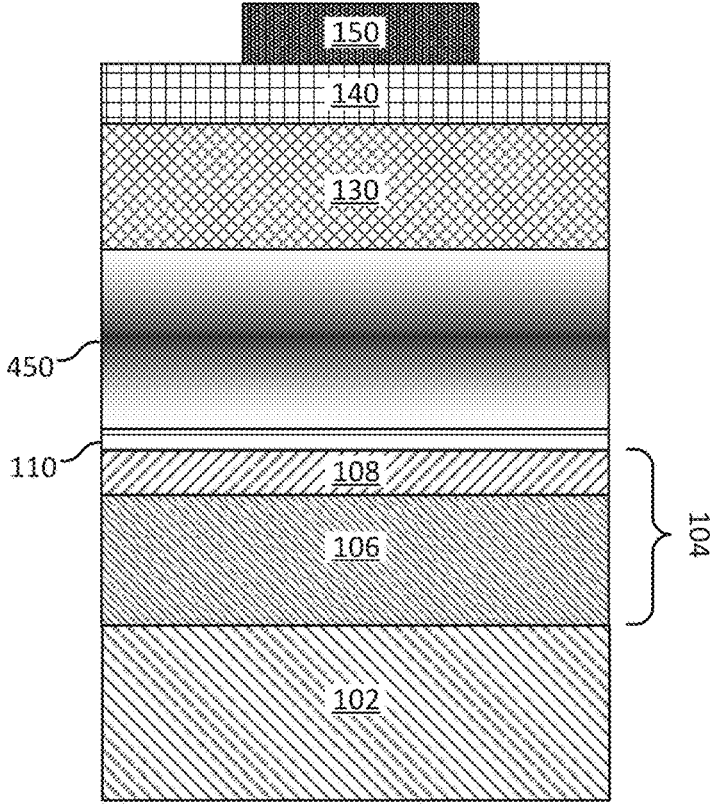
FIGS. 16 and 17 illustrate cross-sectional views of a semiconductor structure at various intermediate stages of fabrication, in accordance with some other embodiments.

FIG. 16 illustrates another embodiment of a semiconductor structure 100 with a mandrel layer 450 having a varying composition gradient. The mandrel layer 450 has a gradient of a species that varies from a lower concentration at a top surface of the mandrel layer 450 to a higher concentration near a midline of the mandrel layer 450 and back to a higher concentration at a bottom surface of the mandrel layer 440.

In various embodiments, the mandrel layer 450 comprises silicon dioxide ($SiO_2$), amorphous silicon, titanium oxide, aluminum oxide, or the like, and the species is an element such as nitrogen, silicon, or the like. As a first example, the mandrel layer 450 comprises silicon dioxide or amorphous silicon and the species is nitrogen that varies from a lower concentration of nitrogen at a top surface of the mandrel layer 450 to a higher concentration of nitrogen at a midline of the mandrel layer 450 and back to a lower concentration of nitrogen at a bottom surface of the mandrel layer 450. As a second example, the mandrel layer 450 comprises titanium oxide or aluminum oxide and the species is silicon that varies from a lower concentration of silicon at a top surface of the mandrel layer 450 to a higher concentration of silicon at a midline of the mandrel layer 450 and back to a lower concentration of silicon at a bottom surface of the mandrel layer 450. This may result in the etch rate of the mandrel layer 450 varying from a higher etch rate at the top surface of the mandrel layer 450 to a lower etch rate at the midline of the mandrel layer 450 and back to a higher etch rate at the bottom surface of the mandrel layer 450.

Figure 17:
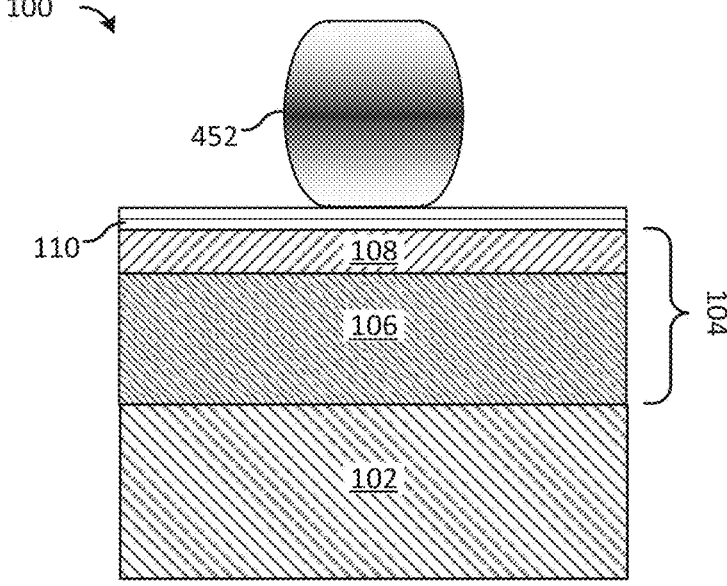

FIG. 17 follows from FIG. 16 and shows a mandrel 452 patterned from the mandrel layer 450. The mandrel 452 may be patterned from the mandrel layer 450 with similar methods as described above for the mandrel 121 with respect to FIGS. 3A-3B. The mandrel 442 has an oblong-shaped profile in a cross-sectional view with convex sidewalls between the top surface and the bottom surface, which may be due to the gradient of density for a species (e.g., nitrogen or silicon) in the mandrel layer 450, increasing from the top surface of the mandrel layer 450 to the midline of the mandrel layer 450, and then decreasing from the midline of the mandrel layer 450 to the bottom surface of the mandrel layer 450.

It should be appreciated that embodiments illustrated by FIGS. 10-17 are non-limiting examples showing possible configurations of mandrel layers and mandrels with different composition gradients and profiles. Any suitable configurations of composition gradients in mandrel layers and resulting mandrel profiles are within the scope of the disclosed embodiments.

Figure 18:
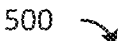
FIG. 18 illustrates an apparatus for performing a deposition process, in accordance with some embodiments.
Figure 18:
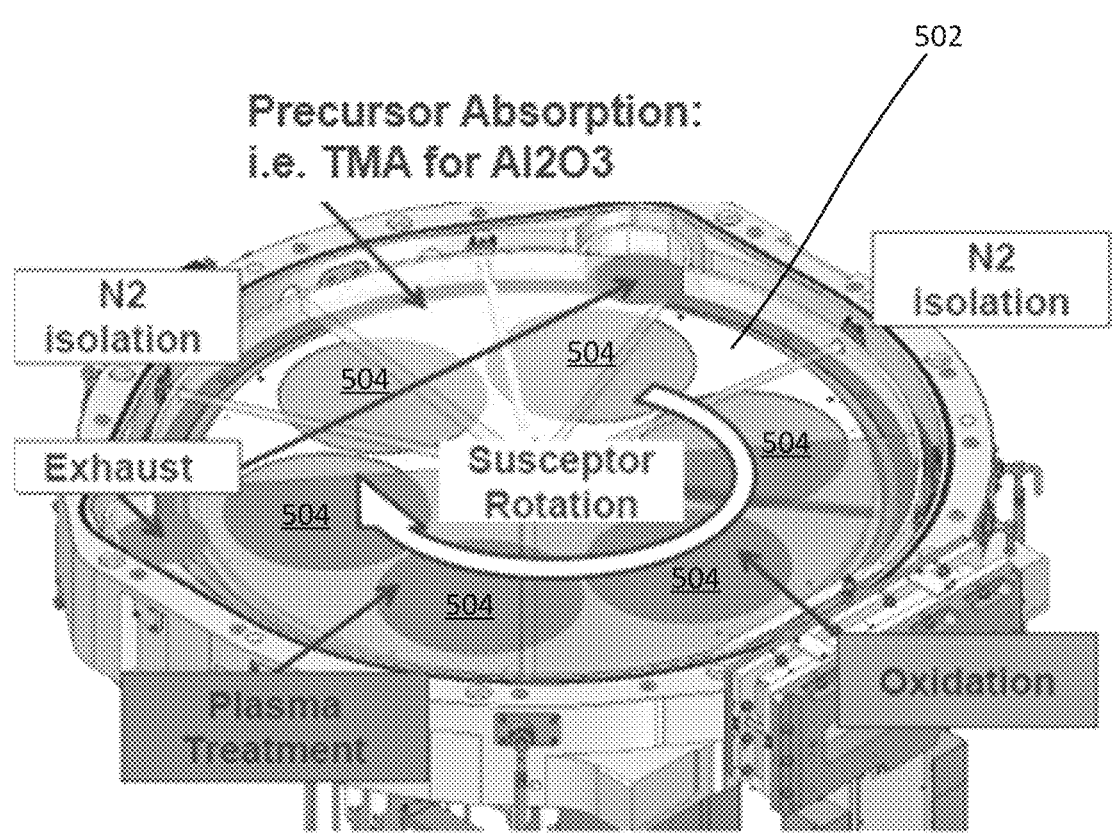

FIG. 18 illustrates an apparatus 500 for performing a spatial atomic layer deposition (ALD) process, in accordance with some embodiments. A susceptor 502 comprises several platters 504, upon which substrates (e.g., silicon wafers) may be deposited. During the spatial ALD process, the susceptor 502 is rotated so that each rotation completes an ALD cycle on each of the substrates. During one ALD cycle, a platter 504 passes through a precursor region where a precursor gas (e.g., trimethylaluminum (TMA) as a precursor for forming an $Al_2O_3$ film or Tetrakis (Dimethylamino) Titanium (TDMAT) as a precursor for forming a $TiO_2$ film) is flowed in order to be absorbed by the substrate on the platter. Next, the platter 504 passes through a reactant region where a reactant (e.g., an oxidizer such as oxygen ($O_2$) plasma or ozone ($O_3$)) is flowed to react with the absorbed precursor to form an oxidized film and a plasma treatment region where the oxidized film is treated with a plasma process. The chemistries of the precursor region, the reactant region, and the plasma treatment region are separated with isolation curtains (e.g, $N_2$ isolation curtains) between regions and/or exhaust ports that remove precursor and reactant gases.

In various embodiments, the susceptor 502 of the apparatus 500 is rotated at varying speeds to achieve films with different compositions and/or composition gradients that provide different etch rates (e.g., the mandrel layer 120 described above with respect to FIG. 2 or the mandrel layers 420, 430, 440, and 450 described above with respect to FIGS. 10, 12, 14, and 16, respectively). A film comprising titanium dioxide deposited by a spatial ALD process with the apparatus 500 may have an etch rate with a dependence on the rotation rate of the susceptor 502. This may be due to the changing reaction time and exposure time for deposition components (e.g, the precursor and the reactant) that occurs with a changing rotation speed of the susceptor 502. For example, a higher rotation rate of the susceptor 502 may reduce exposure time of an oxidizer, which may promote incomplete oxidation of the absorbed precursor and add defects and/or vacancies to the deposited film. In this way, controlling the magnitude of the rotation speed of the susceptor 502 can control the extent of the film oxidation per layer of the deposition and the defectivity, crystallinity, and density of impurities in the film (which may be related to the etch rate of the film). For example, different thermal budgets due to changing rotation rates can produce different degrees of amorphousness and crystallinity in films, which may affect the etch rates of the films through different structural integrity of the films. Higher rotation rates can also produce films with lesser amounts of conformality across the substrates.

Controlling the magnitude of the rotation speed and adjusting deposition gas ratios (e.g., by controlling the flow rates of the precursor and/or reactant) can control the density of components such as nitrogen or silicon in a deposited film, which can achieve films with different etch rates. In some embodiments, the rotation of the susceptor 502 is controlled in a range from 1 rpm to 350 rpm, such as 2 rpm to 240 rpm, to produce mandrel or hardmask layers with different compositions and etch rates. For example, a first layer 122 (see above, FIG. 2) can be formed by spinning the susceptor 502 at a first rotational speed, a second layer 124 (see above, FIG. 2) can be formed by spinning the susceptor 502 at a second rotational speed less than the first rotational speed, and a third layer 126 (see above, FIG. 2) can be formed by spinning the susceptor 502 at a third rotational speed less than the second rotational speed. This can lead to the third layer 126 having a lower etch rate than the second layer 124 and the second layer 124 having a lower etch rate than the first layer 122, which may reduce or prevent a tapering shape of a subsequently formed mandrel 121 (see above, FIGS. 3A-3B).

In some embodiments, the composition of precursor gas and/or reactant gas is changed during operation of the apparatus 500 to produce a film with layers having different compositions. As an example, an ALD process may begin with an aluminum precursor and an oxidizer as a reactant and replacer the aluminum precursor with a titanium precursor, which may produce a film with a lower portion comprising aluminum oxide that transitions to an upper portion comprising titanium oxide. The different materials may be discrete layers (e.g., a layer of titanium oxide over a layer of aluminum oxide) or as a layer with a composition gradient (e.g., an oxide layer that shifts from aluminum oxide at a bottom surface to titanium oxide at a top surface). As another example, an ALD process may begin with a silicon precursor and an oxidizer as a reactant and replacer the oxidizer with a nitridizer as reactant, which may produce a film with a lower portion comprising silicon oxide that transitions to an upper portion comprising silicon nitride. However, any suitable precursors and/or reactants can be used and changed during operation, and any resulting films are within the scope of the disclosed embodiments.

The apparatus 500 is included as an example of a deposition apparatus that may be used for forming mandrel layers. However, any suitable deposition chamber or apparatus using any suitable method of deposition (e.g., CVD, ALD, PVD, the like, or a combination thereof) or otherwise forming a layer or film over a substrate may be used to form mandrel layers such as the mandrel layer 120 (see above, FIG. 2) and are within the scope of the disclosed embodiments.

FIG. 19 illustrates a process flow chart diagram of a method 600 of forming a semiconductor structure 100, in accordance with some embodiments. In step 602, a first mandrel layer (e.g., the first layer 122) with a first etch rate is formed over a target layer 104, as described above with respect to FIG. 2. In step 604, a second mandrel layer (e.g., the second layer 124) with a second etch rate less than the first etch rate is formed over the first mandrel layer, as described above with respect to FIG. 2. In step 606, a third mandrel layer (e.g., the third layer 126) with a third etch rate less than the second etch rate is formed over the second mandrel layer, as described above with respect to FIG. 2. In step 608, a mandrel 121 is patterned by etching the third mandrel layer, the second mandrel layer, and the first mandrel layer, as described above with respect to FIGS. 3A-3B.

FIG. 20 illustrates a process flow chart diagram of a method 700 of forming a semiconductor structure 100, in accordance with some embodiments. In step 702, a mandrel layer (e.g., the mandrel layer 420, 430, 440, or 450) is formed over a target layer 104, as described above with respect to FIG. 10, 12, 14, or 16. The target layer 104 is over a substrate 102. The mandrel layer comprises a composition gradient from a first surface of the mandrel layer to a second surface of the mandrel layer.

In step 704, a mandrel (e.g., the mandrel 422, 432, 442, or 452) is patterned from the mandrel layer, as described above with respect to FIG. 11, 13, 15, or 17. A profile shape of the mandrel is controlled by the composition gradient of the mandrel layer.

In step 706, a spacer 204 is formed on a sidewall of the mandrel, as described above with respect to FIGS. 4-5. In step 708, the mandrel is removed to leave the spacer 204, as described above with respect to FIG. 6. In step 710, the spacer 204 is used as a mask to pattern the target layer 104, as described above with respect to FIG. 7.

FIG. 21 illustrates a process flow chart diagram of a method 800 of forming a semiconductor structure 100, in accordance with some embodiments. In step 802, a substrate 102 is placed in a deposition apparatus (e.g., the apparatus 500) on a platter 504 of a susceptor 502 that is part of the deposition apparatus, as described above with respect to FIGS. 1 and 18. A target layer 104 is over the substrate 102.

In step 804, a first mandrel layer (e.g., the first layer 122 or second layer 124) is formed over the target layer 104 by performing a first atomic layer deposition (ALD) process while rotating the susceptor 502 at a first rotational speed, as described above with respect to FIGS. 2 and 18. In step 806, a second mandrel layer (e.g, the second layer 124 or third layer 126) is formed over the target layer 104 by performing a second ALD process while rotating the susceptor 502 at a second rotational speed that is less the first rotational speed, as described above with respect to FIGS. 2 and 18. In step 808, a mandrel (e.g., the mandrel 121) is formed by patterning the second mandrel layer and the first mandrel layer, as described above with respect to FIGS. 3A-3B.

Example embodiments of the disclosure are summarized here. Other embodiments can also be understood from the entirety of the specification as well as the claims filed herein.

Example 1. A method of forming a semiconductor structure, the method including: forming a first mandrel layer over a target layer, the first mandrel layer having a first etch rate; forming a second mandrel layer over the first mandrel layer, the second mandrel layer having a second etch rate, the second etch rate being less than the first etch rate; forming a third mandrel layer over the second mandrel layer, the third mandrel layer having a third etch rate, the third etch rate being less than the second etch rate; and patterning a mandrel by etching the third mandrel layer, the second mandrel layer, and the first mandrel layer.

Example 2. The method of example 1, where after patterning the mandrel, remaining portions of the first mandrel layer, the second mandrel layer, and the third mandrel layer have aligned sidewalls.

Example 3. The method of example 1, where after patterning the mandrel, a remaining portion of the third mandrel layer is wider than a remaining portion of the second mandrel layer and the remaining portion of the second mandrel layer is wider than a remaining portion of the first mandrel layer.

Example 4. The method of one of examples 1 to 3, further including: forming spacers adjacent to the mandrel; and removing the mandrel with a mandrel pull etch process.

Example 5. The method of example 4, further including: patterning the target layer using the spacers as a mask; and forming a metallization pattern in trenches between remaining portions of the target layer.

Example 6. The method of one of examples 1 to 5, where the first mandrel layer includes silicon oxide, the second mandrel layer includes silicon oxynitride, and the third mandrel layer includes silicon nitride.

Example 7. The method of one of examples 1 to 6, where etching the third mandrel layer, the second mandrel layer, and the first mandrel layer includes a reactive ion etch performed with a mixture of nitrogen and hydrogen.

Example 8. The method of example 7, where etching the third mandrel layer, the second mandrel layer, and the first mandrel layer further includes forming an organic layer on a vertical sidewall of the mandrel.

Example 9. A method of forming a semiconductor structure, the method including: forming a mandrel layer over a target layer of a substrate, the target layer being over the substrate, the mandrel layer including a composition gradient from a first surface of the mandrel layer to a second surface of the mandrel layer; patterning a mandrel from the mandrel layer, a profile shape of the mandrel being controlled by the composition gradient of the mandrel layer; forming a spacer on a sidewall of the mandrel; removing the mandrel to leave the spacer; and using the spacer as a mask to pattern the target layer.

Example 10. The method of example 9, where the composition gradient is between a higher concentration of a species at the second surface of the mandrel layer to a lower concentration of the species at the first surface of the mandrel layer.

Example 11. The method of example 10, where the species is nitrogen.

Example 12. The method of example 10, where the species is silicon.

Example 13. The method of one of examples 10 to 12, where the profile shape of the mandrel is trapezoidal in a cross-sectional view, a top surface of the mandrel being broader than a bottom surface of the mandrel.

Example 14. The method of example 9, where the composition gradient is between a first concentration of a species at the second surface of the mandrel layer, a second concentration of the species at a midline of the mandrel layer, and a third concentration of the species at the first surface of the mandrel layer, the second concentration being smaller than the first concentration and the second concentration.

Example 15. The method of example 14, where the profile shape of the mandrel is hourglass-shaped in a cross-sectional view.

Example 16. The method of example 9, where the composition gradient is between a first concentration of a species at the second surface of the mandrel layer, a second concentration of the species at a midline of the mandrel layer, and a third concentration of the species at the first surface of the mandrel layer, the second concentration being larger than the first concentration and the second concentration.

Example 17. The method of example 16, where the profile shape of the mandrel is oblong-shaped in a cross-sectional view.

Example 18. A method of forming a semiconductor structure, the method including: placing a substrate in a deposition apparatus on a platter of a susceptor, the susceptor being a part of the deposition apparatus, a target layer being over the substrate; forming a first mandrel layer over the target layer by performing a first atomic layer deposition (ALD) process while rotating the susceptor at a first rotational speed; forming a second mandrel layer over the target layer by performing a second ALD process while rotating the susceptor at a second rotational speed, the second rotational speed being less than the first rotational speed; and forming a mandrel by patterning the second mandrel layer and the first mandrel layer.

Example 19. The method of example 18, where the first rotational speed is in a range of 1 rpm to 350 rpm.

Example 20. The method of one of examples 18 or 19, where the first ALD process includes a first precursor and the second ALD process includes a second precursor, the second precursor being different from the first precursor.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method of forming a semiconductor structure, the method comprising:

forming a first mandrel layer over a target layer, the first mandrel layer having a first etch rate;

forming a second mandrel layer over the first mandrel layer, the second mandrel layer having a second etch rate, the second etch rate being less than the first etch rate;

forming a third mandrel layer over the second mandrel layer, the third mandrel layer having a third etch rate, the third etch rate being less than the second etch rate; and patterning a mandrel by etching the third mandrel layer, the second mandrel layer, and the first mandrel layer, wherein etching the third mandrel layer, the second mandrel layer, and the first mandrel layer comprises a reactive ion etch performed with a mixture of nitrogen and hydrogen.

2. The method of claim 1, wherein after patterning the mandrel, remaining portions of the first mandrel layer, the second mandrel layer, and the third mandrel layer have aligned sidewalls.

3. The method of claim 1, wherein after patterning the mandrel, a remaining portion of the third mandrel layer is wider than a remaining portion of the second mandrel layer and the remaining portion of the second mandrel layer is wider than a remaining portion of the first mandrel layer.

4. The method of claim 1, further comprising:

forming spacers adjacent to the mandrel; and removing the mandrel with a mandrel pull etch process.

5. The method of claim 4, further comprising:

patterning the target layer using the spacers as a mask; and forming a metallization pattern in trenches between remaining portions of the target layer.

6. The method of claim 1, wherein the first mandrel layer comprises silicon oxide, the second mandrel layer comprises silicon oxynitride, and the third mandrel layer comprises silicon nitride.

7. The method of claim 1, wherein etching the third mandrel layer, the second mandrel layer, and the first mandrel layer further comprises forming an organic layer on a vertical sidewall of the mandrel.

8. A method of forming a semiconductor structure, the method comprising:

forming a mandrel layer over a target layer of a substrate, the target layer being over the substrate, the mandrel layer comprising a composition gradient from a first surface of the mandrel layer to a second surface of the mandrel layer, the composition gradient being between a higher concentration of a species at the second surface of the mandrel layer and a lower concentration of the species at the first surface of the mandrel layer, the species being nitrogen;

patterning a mandrel from the mandrel layer, a profile shape of the mandrel being controlled by the composition gradient of the mandrel layer;

forming a spacer on a sidewall of the mandrel;

removing the mandrel to leave the spacer; and using the spacer as a mask to pattern the target layer.

9. The method of claim 8, wherein the profile shape of the mandrel is trapezoidal in a cross-sectional view, a top surface of the mandrel being broader than a bottom surface of the mandrel.

10. The method of claim 8, wherein the mandrel layer comprises silicon dioxide.

11. The method of claim 8, wherein the mandrel layer comprises amorphous silicon.

12. The method of claim 8, wherein patterning the mandrel from the mandrel layer comprises a reactive ion etch performed with a mixture of nitrogen and hydrogen.

13. A method of forming a semiconductor structure, the method comprising:

placing a substrate in a deposition apparatus on a platter of a susceptor, the susceptor being a part of the deposition apparatus, a target layer being over the substrate;

forming a first mandrel layer over the target layer by performing a first atomic layer deposition (ALD) process while rotating the susceptor at a first rotational speed, the first mandrel layer comprising a composition gradient from a first surface of the first mandrel layer to a second surface of the first mandrel layer, the composition gradient being between a higher concentration of a species at the second surface of the first mandrel layer and a lower concentration of the species at the first surface of the first mandrel layer, the species being silicon;

forming a second mandrel layer over the target layer by performing a second ALD process while rotating the susceptor at a second rotational speed, the second rotational speed being less than the first rotational speed; and forming a mandrel by patterning the second mandrel layer and the first mandrel layer.

14. The method of claim 13, wherein the first rotational speed is in a range of 1 rpm to 350 rpm.

15. The method of claim 13, wherein the first ALD process comprises a first precursor and the second ALD process comprises a second precursor, the second precursor being different from the first precursor.

16. The method of claim 13, wherein the first mandrel layer comprises titanium oxide.

17. The method of claim 13, wherein the first mandrel layer comprises aluminum oxide.

18. The method of claim 13, wherein a profile shape of the mandrel is trapezoidal in a cross-sectional view.

19. The method of claim 13, wherein a profile shape of the mandrel is oblong-shaped in a cross-sectional view.

20. The method of claim 13, wherein a top surface of the mandrel is broader than a bottom surface of the mandrel.

* * * * *